United States Patent
Kim

(10) Patent No.: US 7,781,821 B2
(45) Date of Patent: Aug. 24, 2010

(54) PARALLEL VARACTOR CAPACITOR WITH VARYING CAPACITANCE

(75) Inventor: Seyeob Kim, Gyeonggi-do (KR)

(73) Assignee: Integrant Technologies Inc., Bundang-Gu (KR)

( * ) Notice: Subject to any disclaimer, the term of this patent is extended or adjusted under 35 U.S.C. 154(b) by 33 days.

(21) Appl. No.: 11/780,355

(22) Filed: Jul. 19, 2007

(65) Prior Publication Data

US 2008/0048236 A1    Feb. 28, 2008

(30) Foreign Application Priority Data

Jul. 21, 2006    (KR) .................. 10-2006-0068478

(51) Int. Cl.
    *H01L 29/93*    (2006.01)
(52) U.S. Cl. .............. 257/312; 257/595; 257/E27.049; 257/E29.345
(58) Field of Classification Search .......... 257/E27.048, 257/E27.049, 312, 480, 595; 438/379
    See application file for complete search history.

(56) References Cited

U.S. PATENT DOCUMENTS 6,351,020 B1 *    2/2002    Tarabbia et al. ............. 257/532
2004/0100340 A1 *    5/2004    Cui et al. .................... 331/176

* cited by examiner

*Primary Examiner*—Lynne Gurley
*Assistant Examiner*—Vernon P Webb
(74) *Attorney, Agent, or Firm*—Foley and Lardner LLP

(57) ABSTRACT

Provided is a parallel-varactor capacitor. The capacitor comprises a first varactor and a second varactor. The first varactor has a first capacitance which varies depending on voltages applied to a first anode and a first cathode. The second varactor has a second capacitance which varies depending on voltages applied to a second anode and a second cathode. The first anode is connected to the second cathode and the first cathode is connected to the second anode.

8 Claims, 7 Drawing Sheets

PARALLEL VARACTOR CAPACITOR WITH VARYING CAPACITANCE

RELATED APPLICATION

This Nonprovisional application claims priority under 35U.S.C. §119(a) on Patent Application No. 10-2006-0068478 filed in Republic of Korea on Jul. 21, 2006, the entire contents of which are incorporated herein by reference.

BACKGROUND OF THE INVENTION

1. Field of the Invention

The present invention relates to a capacitor.

2. Description of the Background Art

FIG. 1 illustrates a construction of a conventional parallel Metal-Insulator-Metal (MIM) capacitor 100 whose first and second MIM capacitors 110 and 120 are connected in parallel.

As shown in FIG. 1, the conventional parallel MIM capacitor 100 has a simple construction but, because of a low capacitance density, has a drawback that when it is used in a circuit requiring high capacitance, the whole circuit increases in volume.

As a solution to such a problem, there is provided a series Metal-Oxide Semiconductor (MOS) capacitor.

FIG. 2 illustrates a construction of a conventional series Metal-Oxide-Semiconductor (MOS) capacitor 200 whose first and second MOS capacitors 210 and 220 are connected in series. An equivalent resistor (R) of more than 500 kΩ is interposed between the first and second MOS capacitors 210 and 220. The equivalent resistor (R) serves to operate the first or second MOS capacitors 210 and 220 in a strong inversion region. However, even in this construction, there occurs a drawback that a volume is not effectively reduced because of the equivalent resistor (R).

SUMMARY OF THE INVENTION

Accordingly, the present invention is to provide a capacitor for maintaining the same capacitance despite having a small size.

In one aspect, there is provided a parallel-varactor capacitor. The parallel-varactor capacitor comprises a first varactor and a second varactor. The first varactor has a first capacitance which varies depending on voltages applied to a first anode and a first cathode of the first varactor. The second varactor has a second capacitance which varies depending on voltages applied to a second anode and a second cathode of the second varactor. The first anode is connected to the second cathode and the first cathode is connected to the second anode.

A resultant capacitance of the first capacitance and the second capacitance may be constant.

The first varactor and the second varactor may be Metal-Oxide Semiconductor (MOS) type varactors.

The resultant capacitance may be constant by varying an MOS characteristic of the first varactor and an MOS characteristic of the second varactor.

The MOS characteristic of the first varactor and the MOS characteristic of the second varactor may be variable depending on a channel width, a channel length, and a doping concentration.

The first capacitance may be equal to the second capacitance.

The parallel-varactor capacitor may be a floating capacitor.

The parallel-varactor capacitor may be symmetric to each other at both terminals.

The first varactor and the second varactor may be formed in a monolithic substrate.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 1:
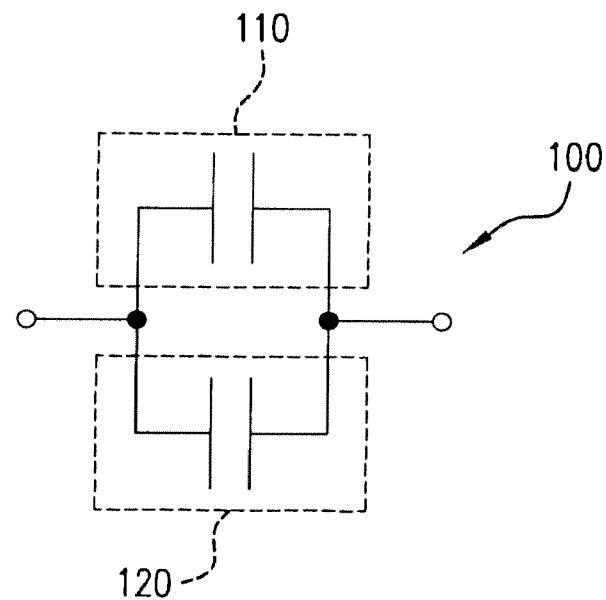
FIG. 1 is a schematic circuit diagram of a conventional parallel Metal-Insulator-Metal (MIM) capacitor whose first and second MIM capacitors are connected in parallel.
Figure 2:
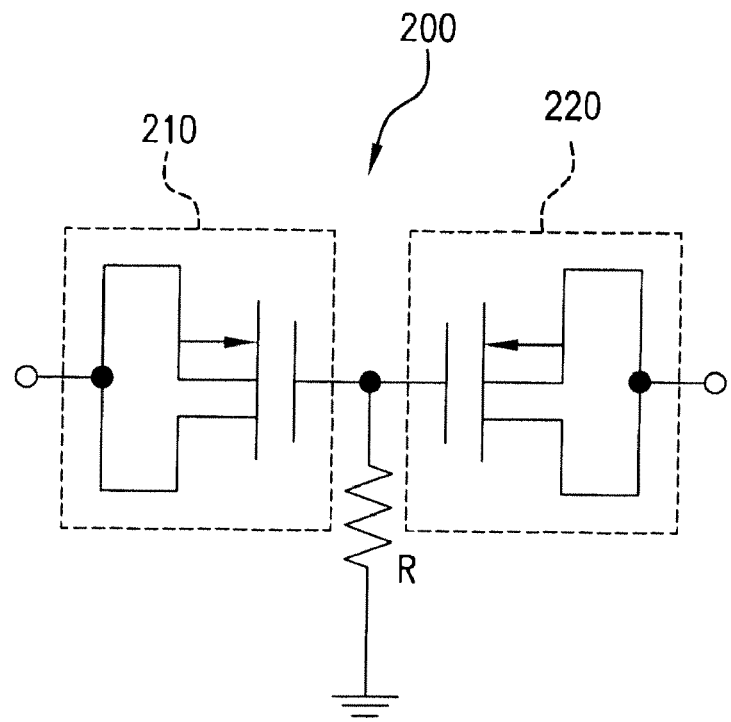
FIG. 2 is a schematic circuit diagram of a conventional series Metal-Oxide-Semiconductor (MOS) capacitor whose first and second MOS capacitors are connected in series.
Figure 3:
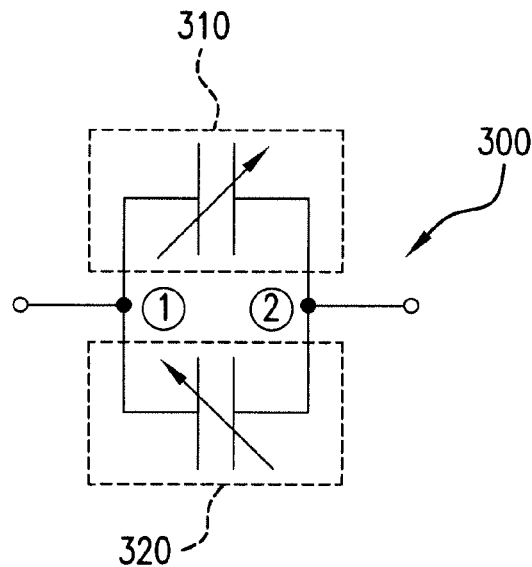
FIG. 3 is a circuit diagram of a parallel varactor capacitor according to the present invention.

FIG. 3 is a circuit diagram of a parallel varactor capacitor according to the present invention.

As shown in FIG. 3, the parallel varactor capacitor 300 according to the present invention comprises a first varactor 310 and a second varactor 320. The first varactor 310 and the second varactor 320 are connected in parallel with each other.

An anode of the first varactor 310 is connected to a first terminal (①). A cathode of the first varactor 310 is connected to a second terminal (②). An anode of the second varactor 320 is connected to the second terminal (②). A cathode of the second varactor 320 is connected to the first terminal (①). In more detail, the anode of the first varactor 310 is electrically connected to the cathode of the second varactor 320 and the cathode of the first varactor 310 is electrically connected to the anode of the second varactor 320.

It is desirable that the first and second varactors 310 and 320 are fabricated by using Metal Oxide Semiconductor (MOS) process. MOS has a different initial capacitance depending on a channel width, a channel length, and a doping concentration. MOS has a characteristic of reducing a capacitance at more than a specific voltage when a positive voltage is applied to MOS and making the capacitance constant at more than a saturation voltage. MOS has a characteristic of constantly maintaining a capacitance up to a specific voltage when a negative voltage is applied to MOS, increasing the capacitance at more than the specific voltage, and again making a capacitance constant at more than a saturation voltage.

The parallel varactor capacitor 300 according to the present invention is based on the above characteristics of MOS. In the parallel varactor capacitor 300, the first varactor 310 and the second varactor 320 are connected in parallel with each other and have variable capacitances depending on voltages. Voltages each opposite in polarity are applied to anodes and cathodes of the first varactor 310 and the second varactor 320. Thus, when a first capacitance of the first varactor 310 decreases, a second capacitance of the second varactor 320 increases, thereby making constant a resultant capacitance of the parallel varactor capacitor 300 according to the present invention.

The parallel varactor capacitor 300 according to the present invention has a construction in which it is symmetric at both terminals because the first varactor 310 and the second varactor 320 are connected in parallel with each other.

For more understanding of a feature of the present invention, a characteristic comparison between a conventional series MOS capacitor shown in FIG. 4A and a parallel varactor capacitor 300 according to the present invention shown in FIG. 5A will be described below.

Figure 4A:
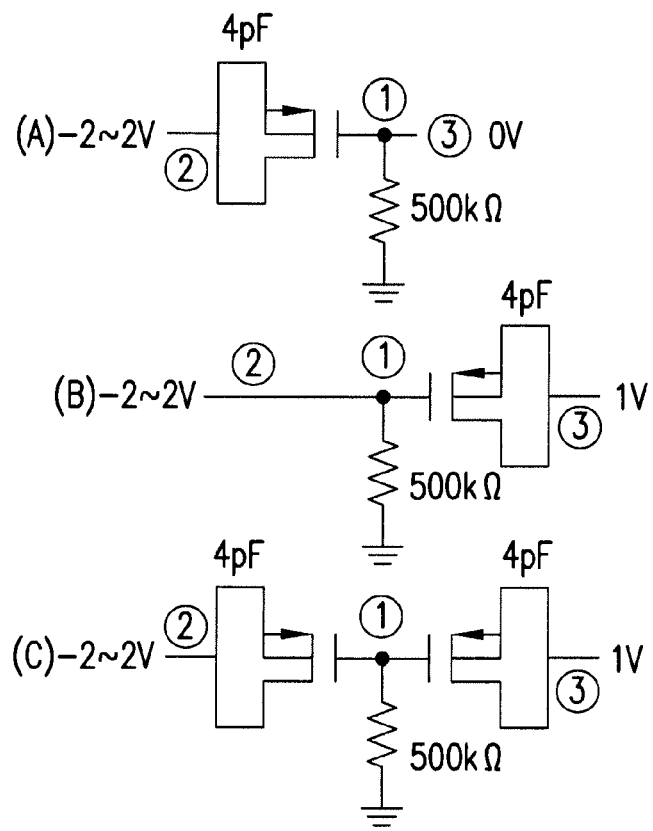
FIGS. 4A and 4B illustrate a capacitance characteristic of a conventional series MOS capacitor.
Figure 4B:
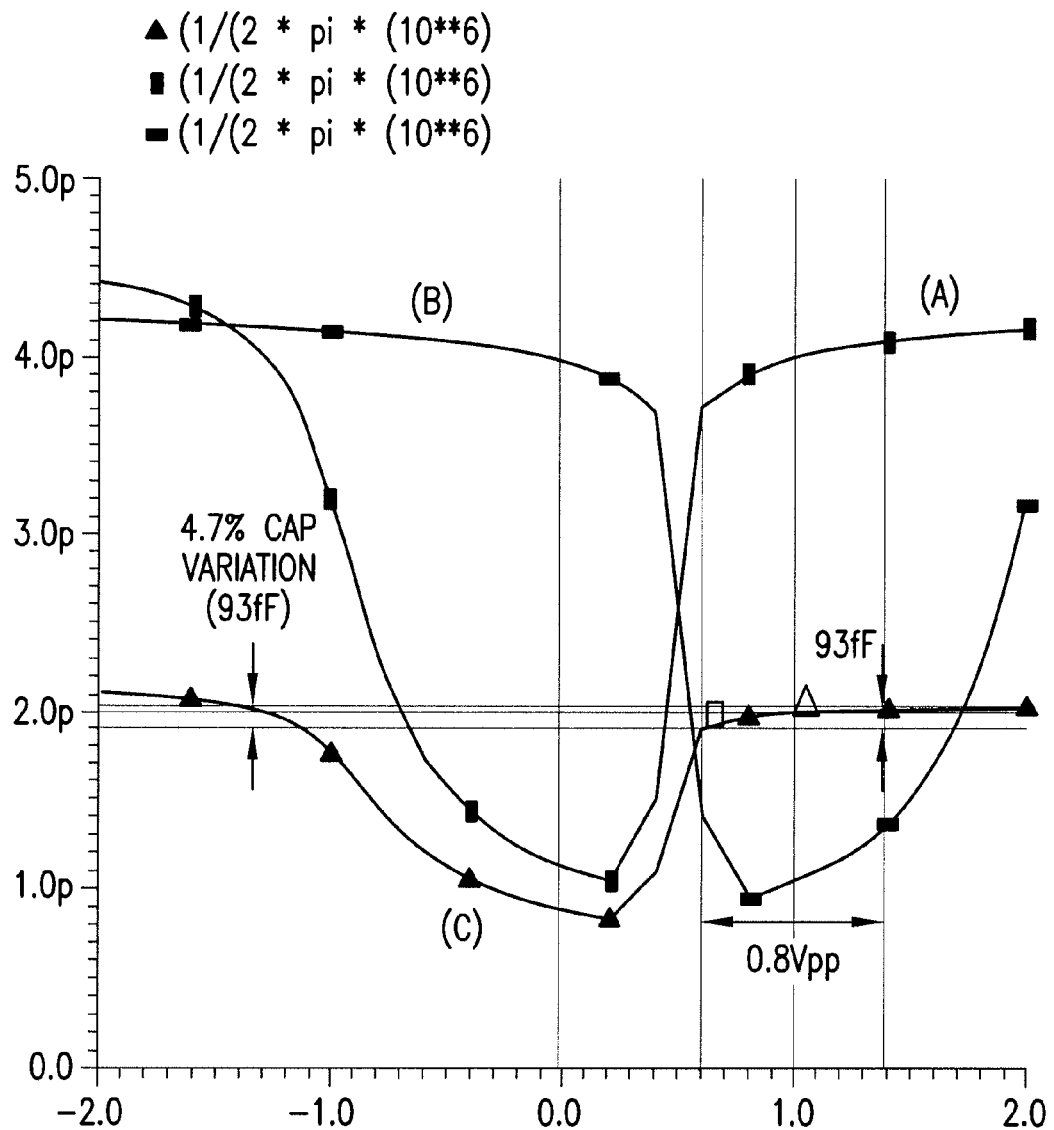

FIG. 4A illustrates a circuit for describing a capacitance variation in the conventional series MOS capacitor 200. FIG. 4B illustrates a capacitance variation in the circuit of FIG. 4A.

In FIG. 4A, a circuit (a) comprises a first MOS capacitor having a capacitance of about 4 pF and a resistor having a resistance of about 500 kΩ. The resistor of about 500 kΩ is electrically connected between the first MOS capacitor and the ground. In FIG. 4B, a graph (a) shows a capacitance variation when 0 V is applied to first and third terminals (①) and (③)) and a voltage applied to a second terminal ((②)) varies from about −2 V to 2 V in the circuit (a) of FIG. 4A. If the voltage applied to the second terminal ((②)) increases from about −2 V to 0.2 V in the circuit (a) of FIG. 4A, a capacitance decreases from about 4.4 pF to 1 pF as shown in the graph (a) of FIG. 4B. If the voltage applied to the second terminal ((②)) increases from about 0.2 V to 0.6 V in the circuit (a) of FIG. 4A, a capacitance rapidly increases from about 1 pF to 3.8 pF as shown in the graph (a) of FIG. 4B. If the voltage applied to the second terminal ((②)) increases from about 0.6 V to 2 V in the circuit (a) of FIG. 4A, a capacitance slowly increases from about 3.8 pF to 4.2 pF as shown in the graph (a) of FIG. 4B.

In FIG. 4A, a circuit (b) comprises a second MOS capacitor having a capacitance of about 4 pF and a resistor having a resistance of about 500 kΩ. The resistor of about 500 kΩ is electrically connected between the second MOS capacitor and the ground. In FIG. 4B, a graph (b) shows a capacitance variation when a first terminal ((①)) has a voltage of about 0 V by applying 1 V to a third terminal ((③)) and a voltage applied to a second terminal ((②)) varies from about −2 V to 2 V in the circuit (b) of FIG. 4A. If the voltage applied to the second terminal ((②)) increases from about −2 V to 0.4 V in the circuit (b) of FIG. 4A, a capacitance slowly decreases from about 4.2 pF to 3.8 pF as shown in the graph (b) of FIG. 4B. If the voltage applied to the second terminal ((②)) increases from about 0.4 V to 0.8 V in the circuit (b) of FIG. 4A, a capacitance rapidly decreases from about 3.8 pF to 1 pF as shown in the graph (b) of FIG. 4B. If the voltage applied to the second terminal ((②)) increases from about 0.8 V to 2 V in the circuit (b) of FIG. 4A, a capacitance rapidly increases from about 1 pF to 3.3 pF as shown in the graph (b) of FIG. 4B.

In FIG. 4A, a circuit (c) comprises first and second MOS capacitors each having a capacitance of about 4 pF and a resistor having a resistance of about 500 kΩ. The first and second MOS capacitors are connected in series with each other. The resistor of about 500 kΩ is electrically connected between the first and second MOS capacitors and the ground. In FIG. 4B, a graph (c) shows a capacitance variation when a first terminal ((①)) has a voltage of about 0 V by applying 1 V to a third terminal ((③)) and a voltage applied to a second terminal ((②)) varies from about −2 V to 2 V in the circuit (c) of FIG. 4A. If the voltage applied to the second terminal ((②)) increases from about −2 V to −1.6 V in the circuit (c) of FIG. 4A, a resultant capacitance slowly decreases from about 2.2 pF to 2 pF as shown in the graph (c) of FIG. 4B. If the voltage applied to the second terminal ((②)) increases from about −1.6 V to 0.2 V in the circuit (c) of FIG. 4A, a resultant capacitance slowly decreases from about 2 pF to 0.9 pF as shown in the graph (c) of FIG. 4B. If the voltage applied to the second terminal ((②)) increases from about 0.2 V to 0.6 V in the circuit (c) of FIG. 4A, a resultant capacitance rapidly increases from about 0.9 pF to 1.9 pF as shown in the graph (c) of FIG. 4B. If the voltage applied to the second terminal ((②)) increases from about 0.6 V to 2 V in the circuit (c) of FIG. 4A, a resultant capacitance slowly increases from about 1.9 pF to 2 pF as shown in the graph (c) of FIG. 4B.

By these results, the conventional series MOS capacitor 200 comprising the first and second MOS capacitors each having the capacitance of about 4 pF can be used for a circuit having a reference voltage of about 1V, a reference voltage range of about 0.6 V to 1.4 V, and a tolerance of about 4.7% based on a capacitance of about 2 pF.

Figure 5A:
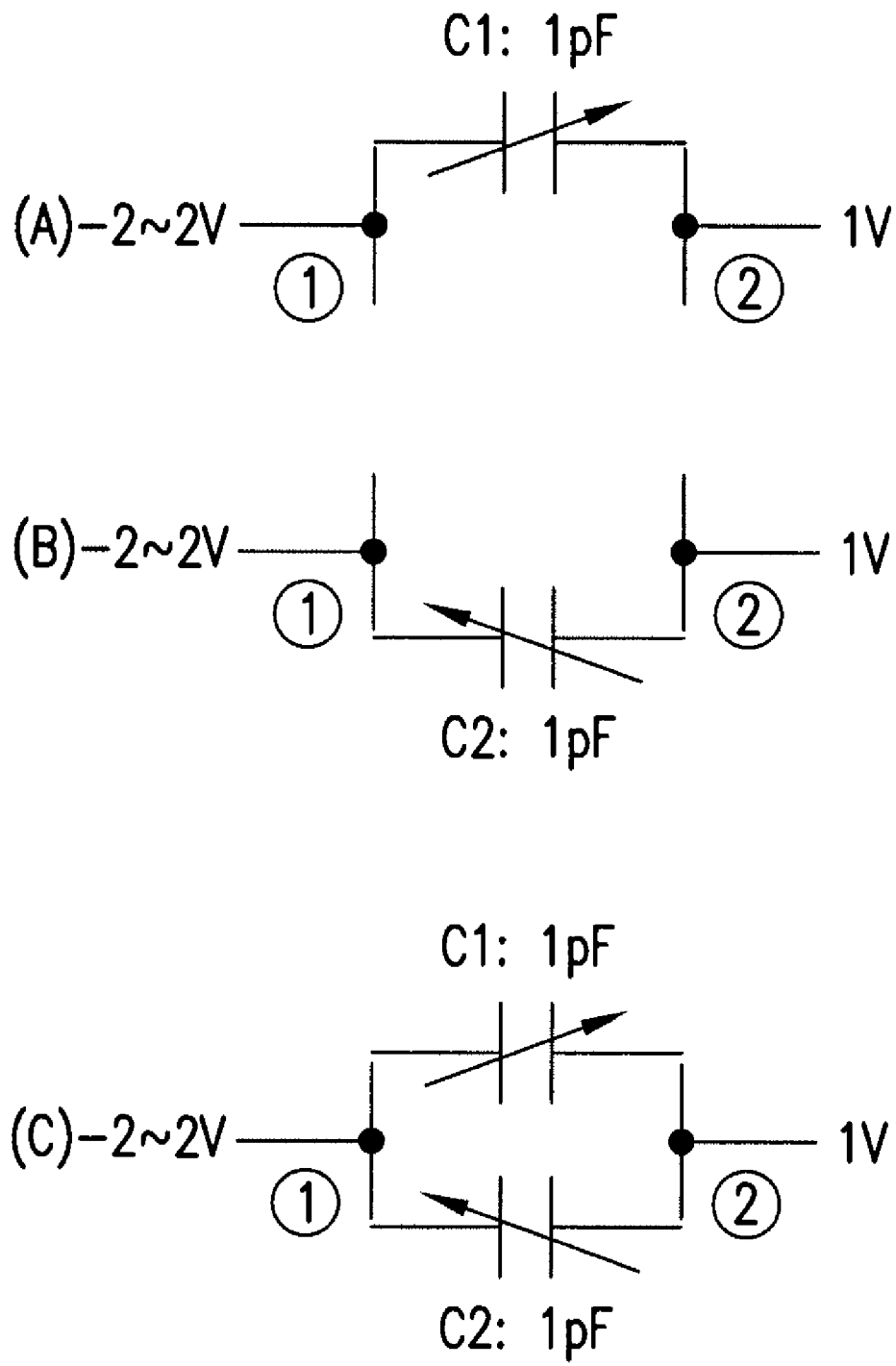
FIGS. 5A and 5B illustrate a capacitance characteristic of a parallel varactor capacitor according to the present invention.
Figure 5B:
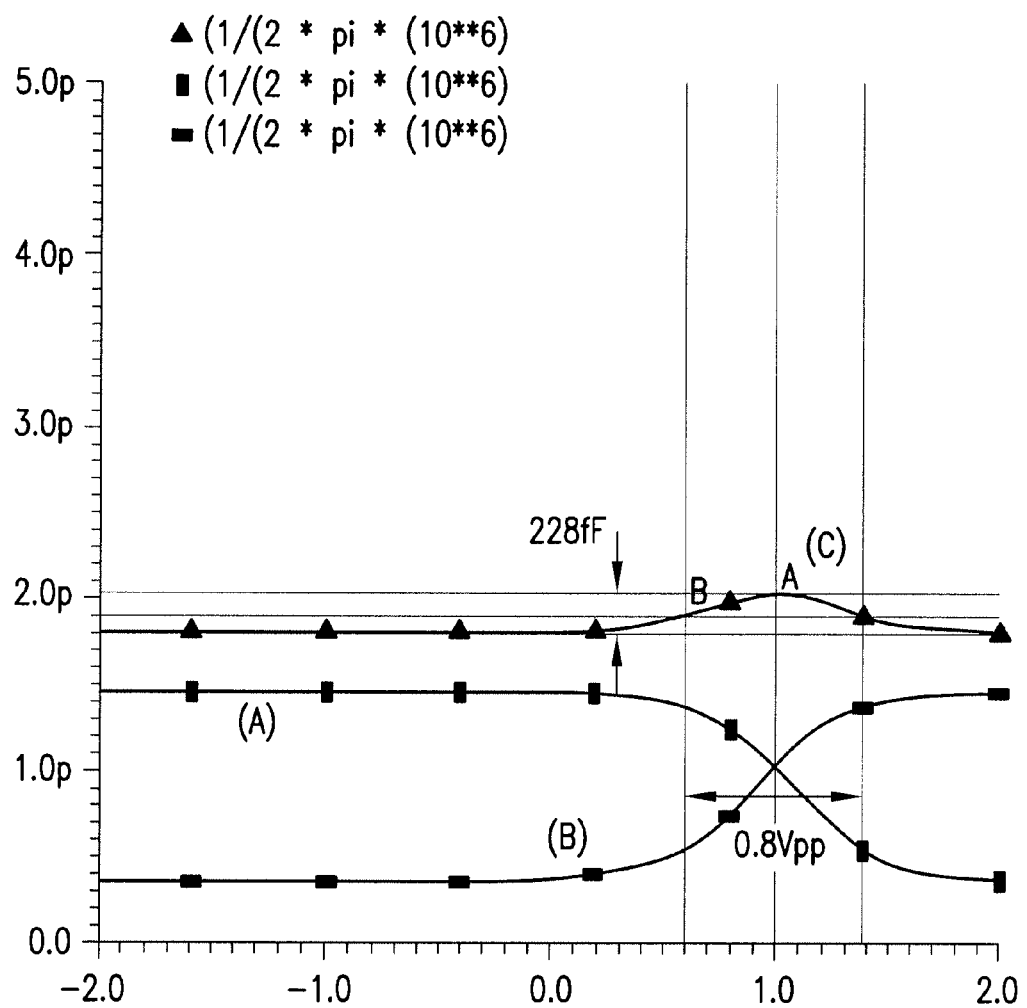

FIG. 5A is a circuit for describing a capacitance variation in a parallel varactor capacitor 300 according to the present invention. FIG. 5B is a graph illustrating a capacitance variation in the circuit of FIG. 5A.

In FIG. 5A, a circuit (a) comprises a first varactor (C1) having a capacitance of about 1 pF. In FIG. 5B, a graph (a) shows a capacitance variation when 1 V is applied to a second terminal ((②)) and a voltage applied to a first terminal ((①)) varies from about −2 V to 2 V in the circuit (a) of FIG. 5A. If the voltage applied to the first terminal ((①)) increases from about −2 V to 0.2 V in the circuit (a) of FIG. 5A, a capacitance is maintained as 1.5 pF as shown in the graph (a) of FIG. 5B. If the voltage applied to the first terminal ((①)) increases from about 0.2 V to 1.4 V in the circuit (a) of FIG. 5A, a capacitance drops from about 1.5 pF to 0.4 pF as shown in the graph (a) of FIG. 5B. If the voltage applied to the first terminal ((①)) increases from about 1.4 V to 2 V in the circuit (a) of FIG. 5A, a capacitance slowly drops from about 0.4 pF to 0.3 pF as shown in the graph (a) of FIG. 5B.

In FIG. 5A, a circuit (b) comprises a second varactor (C2) having a capacitance of about 1 pF. In FIG. 5B, a graph (b) shows a capacitance variation when 1 V is applied to a second terminal ((②)) and a voltage applied to a first terminal ((①)) varies from about −2 V to 2 V in the circuit (b) of FIG. 5A. If the voltage applied to the first terminal ((①)) increases from about −2 V to 0.4 V in the circuit (b) of FIG. 5A, a capacitance is maintained as 0.3 pF as shown in the graph (b) of FIG. 5B. If the voltage applied to the first terminal ((①)) increases from about 0.4 V to 1.4 V in the circuit (b) of FIG. 5A, a capacitance drops from about 0.3 pF to 1.5 pF as shown in the graph (b) of FIG. 5B. If the voltage applied to the first terminal ((①)) increases from about 1.4 V to 2 V in the circuit (b) of FIG. 5A, a capacitance is maintained as 1.5 pF as shown in the graph (b) of FIG. 5B.

In FIG. 5A, a circuit (c) comprises first and second varactor (C1 and C2) each having a capacitance of about 1 pF. The first and second varactor (C1 and C2) are connected in parallel with each other. In FIG. 5B, a graph (c) shows a capacitance variation when 1 V is applied to a second terminal (②) and a voltage applied to a first terminal (①) varies from about -2 V to 2 V in the circuit (c) of FIG. 5A. If the voltage applied to the first terminal (①) increases from about -2 V to 0.2 V in the circuit (c) of FIG. 5A, a resultant capacitance is maintained as 1.8 pF as shown in the graph (c) of FIG. 5B. If the voltage applied to the first terminal (①) increases from about 0.2 V to 1.0 V in the circuit (c) of FIG. 5A, a resultant capacitance slowly rises from about 1.8 pF to 2.0 pF as shown in the graph (c) of FIG. 5B. If the voltage applied to the first terminal (①) increases from about 1.0 V to 2.0 V in the circuit (c) of FIG. 5A, a resultant capacitance slowly drops from about 2.0 pF to 1.8 pF as shown in the graph (c) of FIG. 5B.

As described above, the parallel varactor capacitor 300 according to the present invention comprising the first and second varactors (C1 and C2) each having a capacitance of about 1 pF is used for a circuit having a reference voltage of about 1V, a reference voltage range of about 0.6 V to 1.4 V, and a tolerance of about 6.5% based on a capacitance of about 2 pF. Thus, the parallel varactor capacitor 300 has a constant resultant capacitance despite a variation of a voltage applied in a predetermined voltage range.

Figure 6:
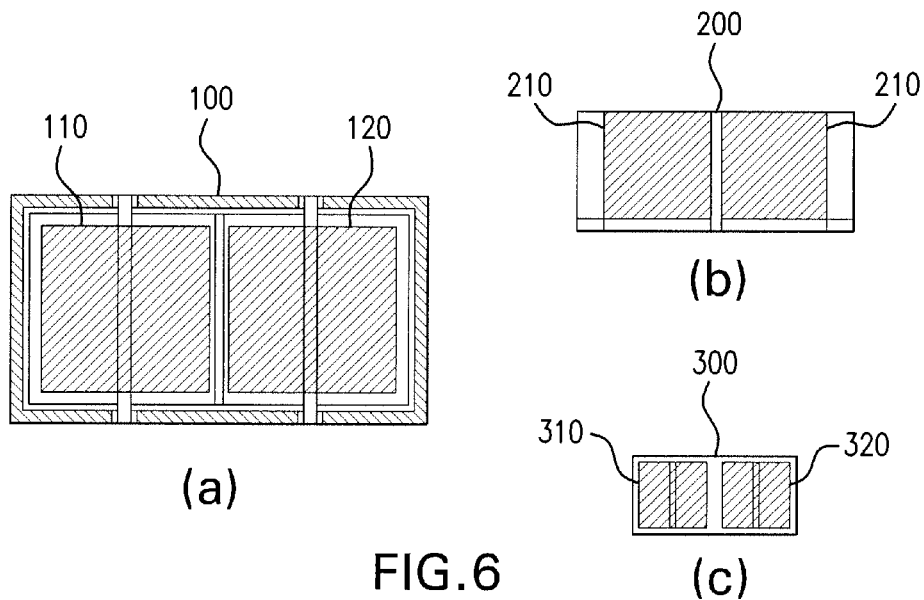
FIG. 6 is a diagram for describing a comparison of areas occupied by a conventional parallel MIM capacitor, a conventional series MOS capacitor, and a parallel varactor capacitor according to the present invention, each having the same capacitance.

FIG. 6 illustrates proportion-based sizes of a conventional parallel MIM capacitor 100, a conventional series MOS capacitor 200, and a parallel varactor capacitor 300 according to the present invention when each of them has the same capacitance.

As shown in FIG. 6, in case where a resultant capacitance is equal to 2 pF, the parallel varactor capacitor 300 according to the present invention has a size of 495 μm$^2$ and is greatly smaller in size than the conventional parallel MIM capacitor 100 having a size of about 3,234 μm$^2$ and the conventional series MOS capacitor 200 having a size of about 1,272 μm$^2$.

Figure 7:
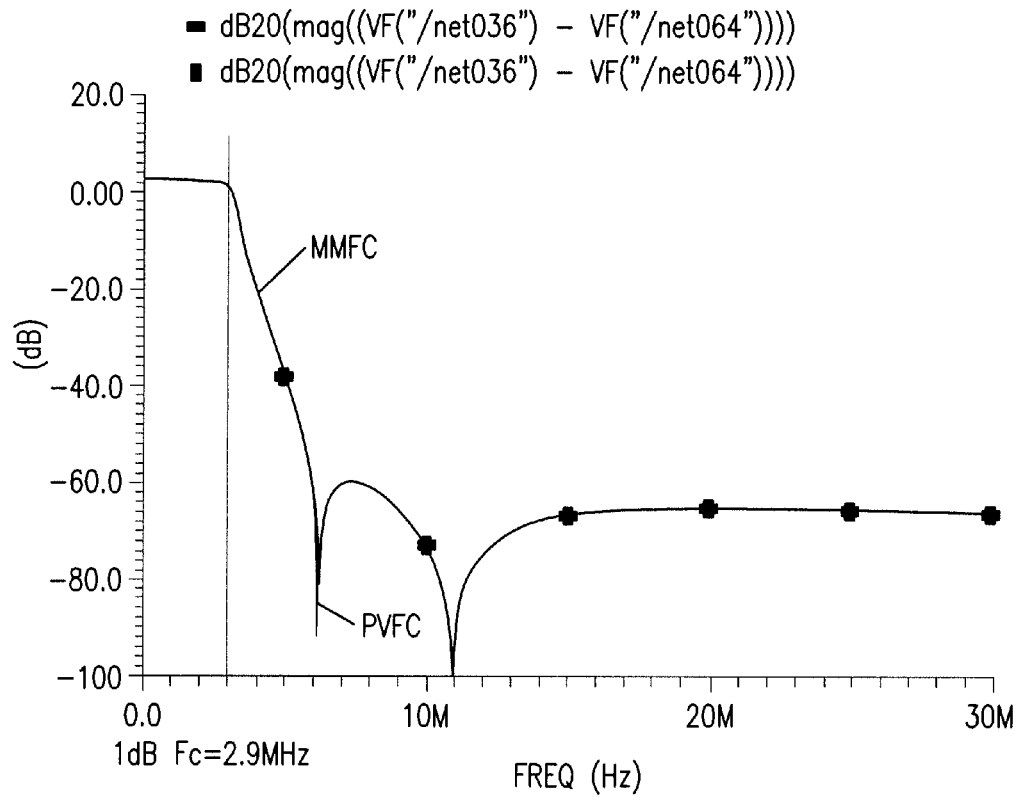
FIG. 7 is a graph illustrating a frequency response in a filter comprising a parallel varactor capacitor to the present invention.

FIG. 7 is a graph illustrating a frequency characteristic in a filter comprising the parallel varactor capacitor 300 according to the present invention.

As shown in FIG. 7, the filter comprising the parallel varactor capacitor 300 according to the present invention has substantially the same cut-off frequency (Fc) and frequency response characteristic as a filter comprising the conventional parallel MIM capacitor 100. In FIG. 7, PVFC is a frequency response characteristic of the filter comprising the parallel varactor capacitor 300 according to the present invention and MMFC is a frequency response characteristic of the filter comprising the conventional parallel MIM capacitor 100. Among characteristics of the filter comprising the parallel varactor capacitor 300 according to the present invention, a 1-dB gain attenuation characteristic, a 3-order InterModulation Distortion (IMD-3) characteristic, an in-band transient characteristic, an out-band transient characteristic, and characteristics in a manufacturing process (TTTT) based on a typical process, a manufacturing process (FFFF) based on a best-case or fast process, and a manufacturing process (SSSS) based on a worst-case or slow process are equal to those of the filter comprising the conventional parallel MIM capacitor 100.

As described above, the parallel varactor capacitor 300 according to the present invention has an advantage of having the same characteristic as and having a high capacitance density compared to the conventional parallel MIM capacitor 100.

Figure 8:
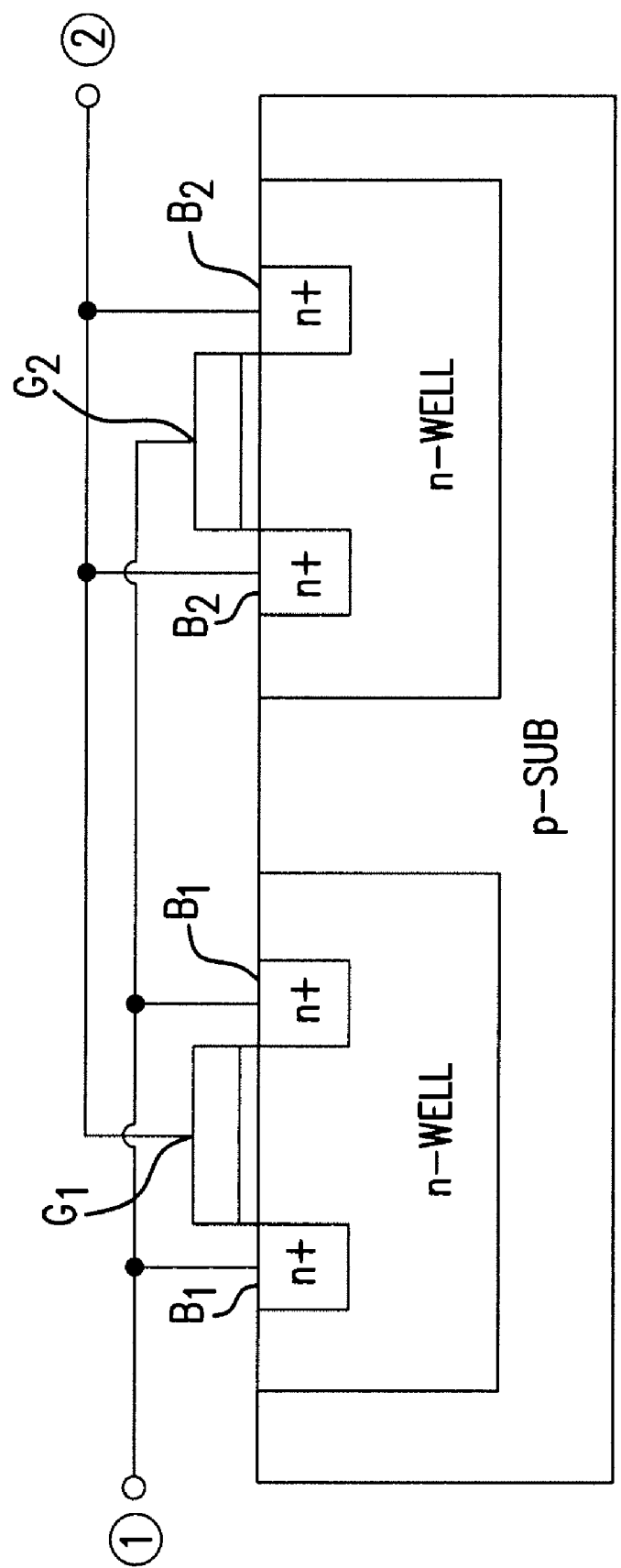
FIG. 8 is a cross sectional view of a parallel varactor capacitor according to the present invention, in which each of two N-type wells is formed in a substrate doped with P-type substance.

FIG. 8 is a cross sectional view of the parallel varactor capacitor 300 according to the present invention, in which each of two N-type wells (n-wells) is formed in a monolithic substrate (P-sub) doped with P-type substance.

As shown in FIG. 8, each of the N-type wells (n-wells) formed in the P-type substrate (P-sub) comprises gates ($G_1$ and $G_2$) and n$^+$ bulk terminals ($B_1$ and $B_2$) The n$^+$ bulk terminals ($B_1$ and $B_2$) formed in the P-type substrate has been exemplified, but various modifications can be made in the spirit of the present invention such as a p$^+$ bulk terminal formed in an N-type substrate.

The first gate (G1), an anode of the second varactor 320 of FIG. 3, is connected to the second terminal (②). The first bulk terminal (B1), a cathode of the second varactor 320 of FIG. 3, is connected to the first terminal (①). The second gate (G2), an anode of the first varactor 310 of FIG. 3, is connected to the first terminal (①). The second bulk terminal (B2), a cathode of the first varactor 310 of FIG. 3, is connected to the second terminal (②).

Accordingly, the parallel varactor capacitor 300 according to the present invention has an advantage in that a manufacturing process is simple, a production cost is cheap, a manufacturing time is reduced, it is easy to form a symmetric construction, and it has a smaller area than a conventional capacitor because the varactors are manufactured to have the same construction in the same process.

As described above, according to the present invention, the capacitor can be formed small in size for the same capacitance.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A parallel-varactor capacitor, comprising:
a first varactor having a first capacitance which varies depending on voltages applied to a first anode and a first cathode of the first varactor; and
a second varactor having a second capacitance which varies depending on voltages applied to a second anode and a second cathode of the second varactor,
wherein the first anode is connected to the second cathode and the first cathode is connected to the second anode so that the first varactor and the second varactor are disposed in parallel and a net capacitance across the first varactor and the second varactor is substantially constant over a range of voltages applied across the first varactor and the second varactor.

2. The parallel-varactor capacitor of claim 1, wherein the first varactor and the second varactor are Metal-Oxide Semiconductor(MOS) type varactors.

3. The parallel-varactor capacitor of claim 2, wherein the resultant capacitance is constant by varying an MOS characteristic of the first varactor and an MOS characteristic of the second varactor.

4. The parallel-varactor capacitor of claim 3, wherein the MOS characteristic of the first varactor and the MOS characteristic of the second varactor are variable depending on a channel width, a channel length, and a doping concentration.

5. The parallel-varactor capacitor of claim 1, wherein the first capacitance is equal to the second capacitance.

6. The parallel-varactor capacitor of claim 1, being a floating capacitor.

7. The parallel-varactor capacitor of claim 1, wherein the first varactor and the second varactor are formed in a monolithic substrate.

8. The parallel-varactor capacitor of claim 1, wherein the overall capacitance range is 0.05 pico farad per 1 Volt.

* * * * *